(12) United States Patent
Cooney, III et al.

(10) Patent No.: US 9,893,023 B2
(45) Date of Patent: Feb. 13, 2018

(54) SEMICONDUCTOR CHIP WITH ANTI-REVERSE ENGINEERING FUNCTION

(71) Applicant: INTERNATIONAL BUSINESS MACHINES CORPORATION, Armonk, NY (US)

(72) Inventors: Edward C. Cooney, III, Jericho, VT (US); Fen Chen, Williston, VT (US); Jonathan M. Pratt, Essex Junction, VT (US); Jason P. Ritter, Jericho, VT (US); Patrick S. Spinney, Charlotte, VT (US); Anna Tilley, Hillsboro, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/606,178

(22) Filed: May 26, 2017

(65) Prior Publication Data

US 2017/0263574 A1 Sep. 14, 2017

Related U.S. Application Data

(62) Division of application No. 14/862,700, filed on Sep. 23, 2015, now Pat. No. 9,711,464.

(51) Int. Cl.
*H01L 21/76* (2006.01)
*H01L 21/768* (2006.01)
(Continued)

(52) U.S. Cl.
CPC ...... *H01L 23/573* (2013.01); *H01L 21/76895* (2013.01); *H01L 23/5226* (2013.01)

(58) Field of Classification Search
CPC ....... H01L 21/00; H01L 21/76; H01L 21/768; H01L 21/76895; H01L 21/78; H01L 21/44
(Continued)

(56) References Cited

U.S. PATENT DOCUMENTS 3,742,120 A 6/1973 Keister et al.
5,744,244 A 4/1998 Camilletti et al.
(Continued)

OTHER PUBLICATIONS

Banerjee, N. et al.; From Chips to Dust: The Mems Shatter Secure Chip; Mems 2014; Jan. 26-30, 2014; pp. 1123-1126.
(Continued)

*Primary Examiner* — Chuong A Luu
(74) *Attorney, Agent, or Firm* — Schmeiser, Olsen & Watts; Steven Meyers

(57) ABSTRACT

A structure and a method. The structure includes a semiconductor substrate; a stack of wiring levels from a first wiring level to a last wiring level, the first wiring level closest to the semiconductor substrate and the last wiring level furthest from the semiconductor substrate, the stack of wiring levels including an intermediate wiring level between the first wiring level and the last wiring level; active devices contained in the semiconductor substrate and the first wiring level, each wiring level of the stack of wiring levels comprising a dielectric layer containing electrically conductive wire; a trench extending from the intermediate wiring level, through the first wiring level into the semiconductor substrate; and a chemical agent filling the trench, portions of at least one wiring level of the stack of wiring levels not chemically inert to the chemical agent or a reaction product of the chemical agent.

5 Claims, 9 Drawing Sheets

(51) Int. Cl.
*H01L 23/00* (2006.01)
*H01L 23/522* (2006.01)

(58) Field of Classification Search
USPC .......................................................... 257/622
See application file for complete search history.

(56) References Cited

U.S. PATENT DOCUMENTS

| | | | | |
|---|---|---|---|---|
| 6,784,972 | B2* | 8/2004 | Nagahashi | .......... G03F 7/70858 |
| | | | | 355/30 |
| 2007/0190718 | A1 | 8/2007 | Coolbaugh et al. | |
| 2010/0143609 | A1 | 6/2010 | Fukazawa et al. | |
| 2014/0027910 | A1 | 1/2014 | Zhang et al. | |
| 2015/0155363 | A1* | 6/2015 | Nakazawa | .............. H01L 29/45 |
| | | | | 257/43 |
| 2015/0221714 | A1* | 8/2015 | Gu | ...................... H01L 23/5223 |
| | | | | 257/532 |
| 2017/0084552 | A1 | 3/2017 | Cooney, III et al. | |

OTHER PUBLICATIONS

Banerjee, Niladri et al.; Microfluidic Device for Triggered Chip Transience; 2013 IEEE Sensors; Nov. 3-6, 2013; 4 pages.

Gu, Xinwei et al.; Simulation Research on a Novel Micro-fluidic Self-destruct Device for Microchips; 5th IEEE International Conference on Nano/MicroEngineered and Molecular Systems; Jan. 20-23, 2010; pp. 375-378.

Pandey, Shashank S. et al.; An Exothermal Energy Release Layer for Microchip Transience; 2013 IEEE Sensors; Nov. 3-6, 2013; 4 pages.

Pandey, Shashank S. et al.; Energy Efficient Chip Transience With Superabsorbent Polymer Actuators; 2014 IEEE Sensors; Nov. 2-5, 2014; 4 pages.

Friedman, Mark J.; List of IBM Patents or Patent Applications Treated as Related; May 26, 2017; 1 page.

* cited by examiner

SEMICONDUCTOR CHIP WITH ANTI-REVERSE ENGINEERING FUNCTION

This application is a divisional application claiming priority to Ser. No. 14/862,700 filed Sep. 23, 2015 now U.S. Pat. No. 9,711,464.

BACKGROUND

The present invention relates to the field of integrated circuits; more specifically, it relates to semiconductor chips with anti-reverse engineering functions and methods of fabricating semiconductor chips with anti-reverse engineering functions.

Semiconductor chips often contain intellectual property or sensitive structures that can be reverse-engineered resulting in the potential loss of such information or the disclosure of sensitive information. Accordingly, there exists a need in the art to mitigate the deficiencies and limitations described hereinabove.

SUMMARY

A first aspect of the present invention is a structure, comprising: a semiconductor substrate; a stack of wiring levels from a first wiring level to a last wiring level, the first wiring level closest to the semiconductor substrate and the last wiring level furthest from the semiconductor substrate, the stack of wiring levels including an intermediate wiring level between the first wiring level and the last wiring level; active devices contained in the semiconductor substrate and the first wiring level, each wiring level of the stack of wiring levels comprising a dielectric layer containing electrically conductive wire; a trench extending from the intermediate wiring level, through the first wiring level into the semiconductor substrate; and a chemical agent filling the trench, portions of at least one wiring level of the stack of wiring levels not chemically inert to the chemical agent or a reaction product of the chemical agent.

A second aspect of the present invention is a structure, comprising: a semiconductor substrate; a stack of wiring levels from a first wiring level to a last wiring level, the first wiring level closest to the semiconductor substrate and the last wiring level furthest from the semiconductor substrate, the stack of wiring levels including an intermediate wiring level between the first wiring level and the last wiring level; active devices contained in the semiconductor substrate and the first wiring level, each wiring level of the stack of wiring levels comprising a dielectric layer containing electrically conductive wire; a first trench extending from the intermediate wiring level, through the first wiring level into the semiconductor substrate; a second trench extending from the intermediate wiring level, through the first wiring level into the semiconductor substrate; and a first chemical agent filling the first trench and a second chemical agent filling the second trench, portions of at least one wiring level of the stack of wiring levels not chemically inert to a reaction product of the first chemical agent and the second chemical agent or can be physically damaged by the reaction product.

A third aspect of the present invention is a method, comprising: providing a semiconductor substrate; forming a stack of wiring levels from a first wiring level to an intermediate wiring level, the first wiring level closest to the semiconductor substrate and the intermediate wiring level furthest from the semiconductor substrate; forming active devices contained in the semiconductor substrate and the first wiring level, each wiring level of the stack of wiring levels comprising a dielectric layer containing electrically conductive wire; forming one or more trenches extending from the intermediate wiring level, through the first wiring level into the semiconductor substrate; (i) filling the one or more trenches with a first chemical agent that can cause damage to or destroy portions of at least one wiring level of the stack of wiring levels or (ii) filling a first group of the one or more trenches with a second chemical agent and a filling a second group of the one more trenches a third chemical agent, a mixture of the second chemical agent and the third chemical agent generating a fourth chemical agent that can cause damage to or destroys portions of at least one wiring level of the stack of wiring levels; forming caps on the one or more trenches; and forming one or more additional wiring levels on top of the intermediate wiring level.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The anti-reverse engineering structures according to the embodiments of the present invention comprise sealed trenches completely within the active and wiring levels of a semiconductor chip. The sealed trenches contain chemical agents that will damage or destroy one or more of the materials in the various layers of the semiconductor chip and/or the semiconductor substrate by chemical attack or physical or thermal stress when the seal around the trench is broken, thereby preventing reverse engineering or making reverse engineering very difficult.

The anti-reverse engineering structures according to embodiments of the present invention are not formed above the wiring levels of the chip and are not formed in the bottom side of the semiconductor substrate (the side opposite from the top side of the semiconductor chip where active devices such as transistors are formed). Rather the sealed trenches containing the chemical agents are contained completely within the active and wiring levels of a semiconductor chip making them difficult to detect as they not visible. One or more of the materials of the semiconductor chip are not chemically inert to chemical agents or are not chemically inert to chemical agents generated by the reaction of the chemical agent with air, oxygen or water, or are not chemically inert to a chemical agent generated by the mixing of two different chemical agents contained in different trenches. The anti-reverse engineering structures according to embodiments of the present invention are passive in that they do not require heat or electrical ignition to activate.

Figure 1:
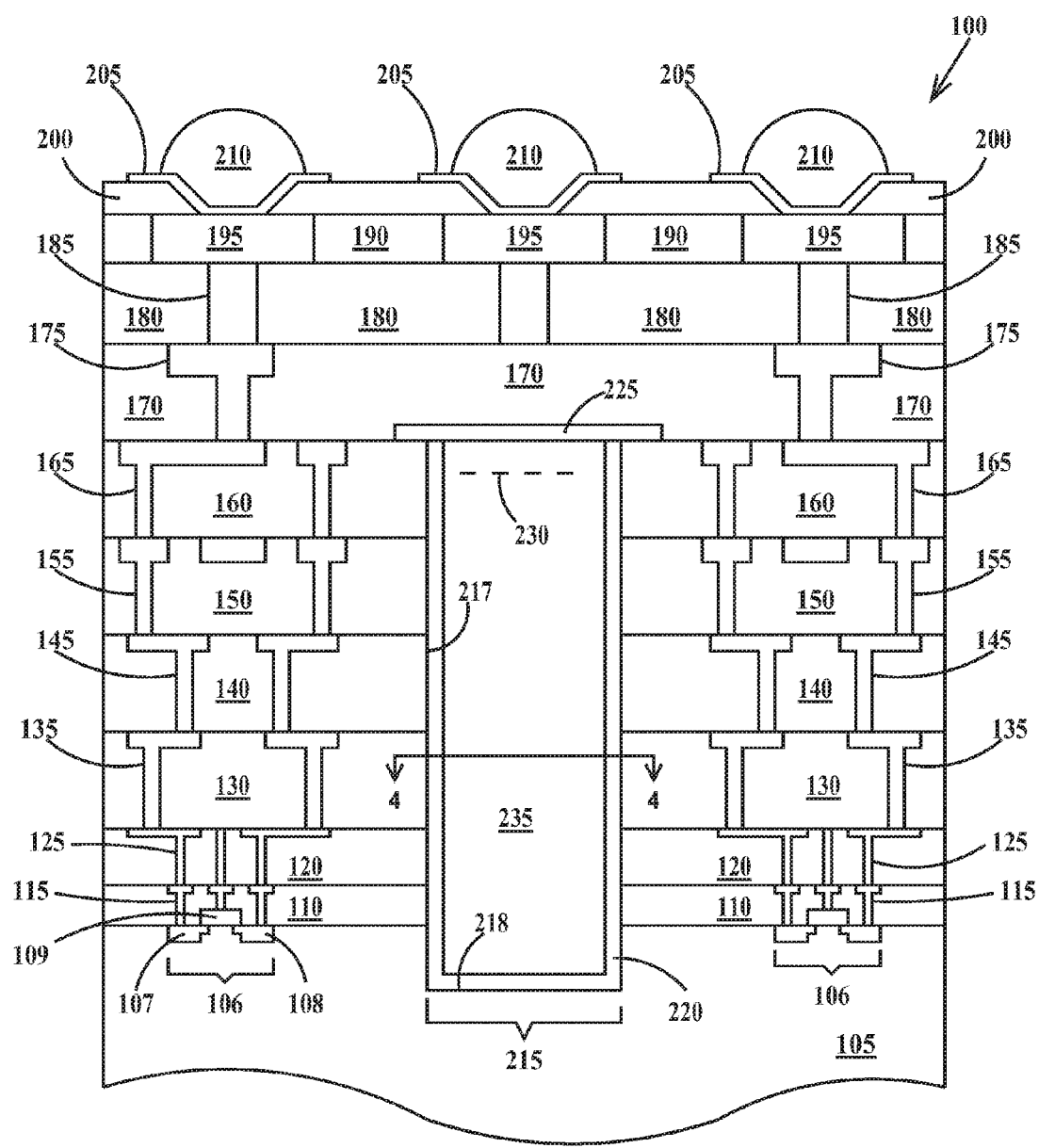
FIG. 1 is a cross-section of an exemplary integrated circuit containing an anti-reverse engineering structure according embodiments of the present invention.

FIG. 1 is a cross-section of an exemplary integrated circuit containing an anti-reverse engineering structure according embodiments of the present invention. In FIG. 1, semiconductor chip 100 includes a semiconductor substrate (i.e., a silicon or silicon on insulator) and first dielectric layer 110. First dielectric layer 110 may itself be formed from two or more dielectric layers examples of which silicon dioxide ($SiO_2$), silicon nitride ($Si_3N_4$), silicon carbide (SiC), silicon oxy nitride (SiON), silicon oxy carbide (SiOC), plasma-enhanced silicon nitride ($PSiN_x$) and Borophosphosilicate glass (BPSG). Formed in substrate 105 and first dielectric layer 110 are field effect transistors (FETs) 106 which comprise source/drains 107 and 108 and gates 109. FETs 106 are electrically contacted by wires 115 in first dielectric layer 110.

Formed in a stack on first dielectric layer 110 are a series of wiring levels containing electrically conductive wires embedded in corresponding dielectric layers. Second dielectric layer 120 contains wires 125, third dielectric layer 130 contains wires 135, fourth dielectric layer 140 contains wires 145, fifth dielectric layer 150 contains wires 155, sixth dielectric layer 160 contains wires 165, seventh dielectric layer 170 contains wires 175, eighth dielectric layer 180 contains wires 185 and ninth dielectric layer 190 contains electrically conductive pads 195. Formed on top of ninth dielectric layer is a dielectric passivation layer 200. An electrically conductive pad limiting metallurgy (PLM) layer 205 is formed in openings in passivation layer 200 and electrically conductive solder bumps 210 are formed on PLM layers 205. Wires 110, 120, 130, 140, 150, 160, 170, 180 and pads 195 interconnect FETs 106 into integrated circuits and provide input/output (I/O) and power connections to semiconductor chip 100 through solder bumps 210.

In one example, dielectric layers 110, 120, 130, 140, 150, 160 170, 180 and 190 are themselves comprised of two or more dielectric layers. In one example, dielectric layers 110, 120, 130, 140, 150, 160 170, 180 and 190 independently comprise $SiO_2$, $Si_3N_4$, high density plasma (HDP) oxide, tetraethyl orthosilicate (TEOS) chemical vapor deposited (CVD) SiO2, hydrogen silsesquioxane polymer (HSQ), methyl silsesquioxane polymer (MSQ), methyl doped silica or $SiO_x(CH_3)_y$, or $SiC_xO_yH_y$ or SiOCH, organosilicate glass (SiCOH), and porous SiCOH. In one example, passivation layer 200 comprises polyimide. In one example, wires 115, 125, 135, 145, 155, 165, 175, 185 and pads 195 independently comprise one or more layers of copper (Cu), tungsten (W), aluminum (Al) aluminum copper (AlCu), aluminum copper silicon (AlCuSi), titanium (Ti), tantalum (Ta), tungsten nitride (WN), titanium nitride(TiN) and tantalum nitride TaN).

Formed in semiconductor substrate 105 and extending through dielectric layers 110, 120, 130, 140, 150 and 160, but not extending into dielectric layer 170, is a trench 215. Formed on the sidewalls 217 and bottom 218 of trench 215 is a liner 220. Liner 220 may be formed from one or more layers. (See FIG. 9 and description infra for an example). Formed in dielectric layer is a cap 225 that seals the top of trench 215. Cap 225 may extend into trench 215. Cap 225 may be formed from one or more layers. Cap 225 may be formed from the same materials as liner 220. In one example, liner 220 and cap 225 independently comprise one or more layers of gold (Au), platinum (Pt), Ti, Ta, $Si_3N_4$, a stress absorption layer and TEOS oxide5. Remaining space (that space not taken up by liner 220) in trench is either completely filled or partially filled (to line 230) with an agent 235. Partially filling trench 215 allows for expansion of agent 235 when integrated circuit chip is subjected to heat during fabrication, in one example, up to 430° C. Agent 235 will (i) chemically attack one or more of the materials in the various layers of the semiconductor chip and/or the semiconductor substrate or (ii) generate an agent that will chemically attack one or more of the materials in the various layers of the semiconductor chip and/or the semiconductor substrate when exposed to air (i.e., the oxygen in air) or water. Liner 220 and cap 225 are not attacked by agent 235.

In one example, agent 235 comprises a material that reacts with oxygen. In one example, agent 235 comprises a material that reacts with water. In one example, agent 235 comprises boron trichloride ($BCl_3$) which reacts with water to form HCl. In one example, agent 235 comprises trichlorosilane ($SiCl_3H$) which reacts with air to form HCl. In one example, agent 235 comprises iron (Fe) or aluminum (Al) in an oxygen free slurry which will reacts with air exothermically. In one example, agent 235 comprises hydrofluoric acid (HF) or buffered HF (BHF), hydrochloric acid (HCl), phosphoric acid (H3PO4), nitric acid (HNO3) or potassium hydroxide (KOH). In one example, agent 235 comprises sodium polyacrylate.

While nine wiring levels are illustrated in FIG. 1, there may be less than nine or more than nine. While trench 215 is illustrated extending from within substrate 105 up through dielectric layer 170, trench 215 may extend into layers above dielectric layer 160 or only to a layer below dielectric layer 160. The terms above and below are defined in the frame of reference where silicon substrate 105 is the bottom of the semiconductor chip and passivation layer 200 is the top of the semiconductor chip. While one filled and capped trench 215 is illustrated in FIG. 1, there may be multiple filled and capped trenches distributed throughout the semiconductor chip. Multiple filled and capped trenches may be disturbed individually or in groups of tens to hundreds. Groups of filled and capped trenches may be distributed throughout the semiconductor chip or in specific regions of the semiconductor chip that are deemed sensitive.

Figure 2:
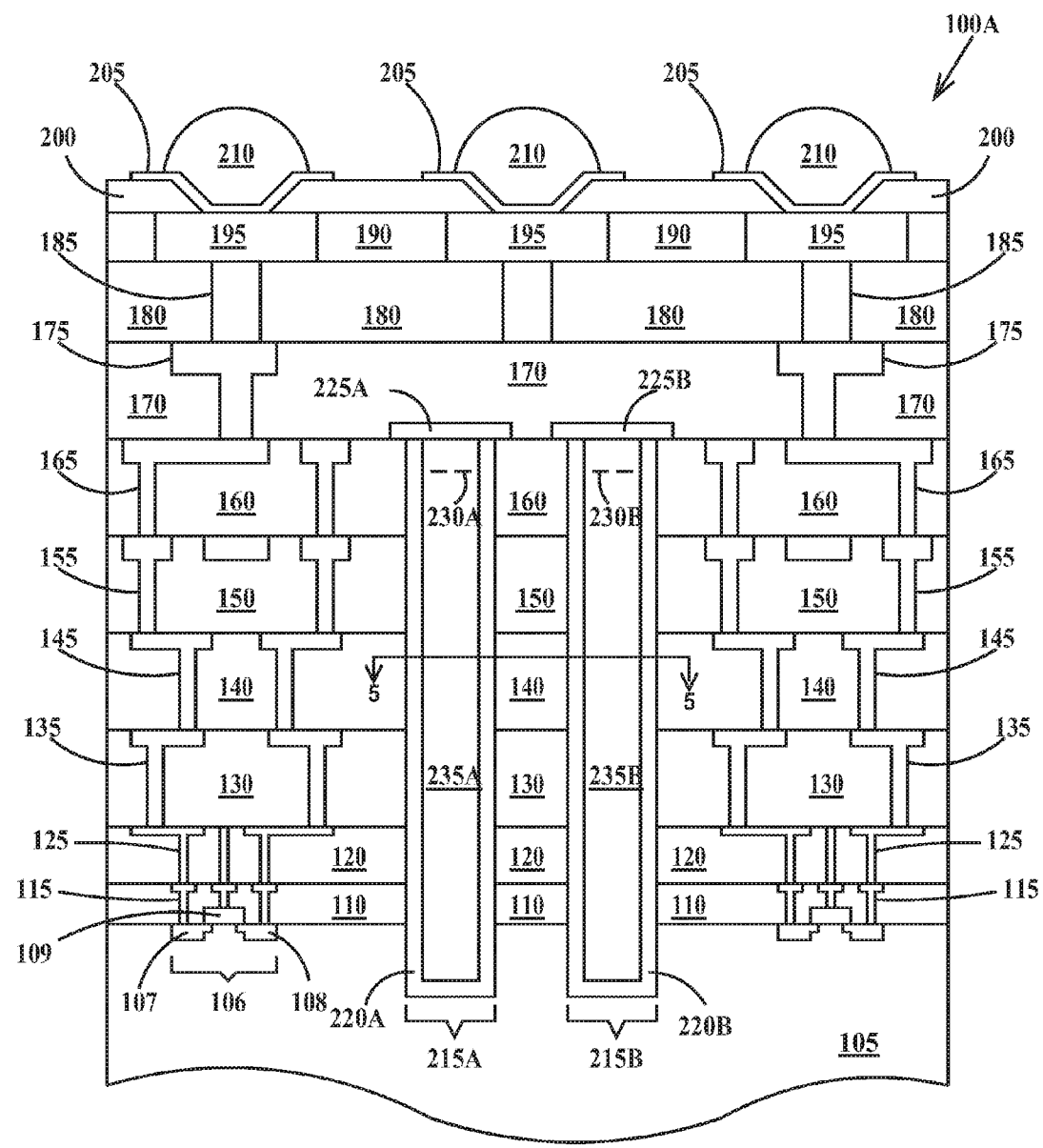
FIG. 2 is a cross-section of an exemplary integrated circuit containing a binary anti-reverse engineering structure according embodiments of the present invention.

FIG. 2 is a cross-section of an exemplary integrated circuit containing a binary anti-reverse engineering structure according embodiments of the present invention. Semiconductor chip 100A of FIG. 2 is similar to semiconductor chip 100 of FIG. 1. In FIG. 2, trench 215 of FIG. 1 is replaced with a pair of trenches, a first trench 215A and a second trench 215B. First trench 215A includes a first liner 220A, a first cap 225A and a first agent 235A that either completely fills remaining space (that space not taken up by liner 220A) in trench 215A or fills the remaining space in trench 215A to line 230A. Second trench 215B includes a second liner 220B, a second cap 225B and a second agent 235B that either completely fills remaining space (that space not taken up by liner 220B) in trench 215B or fills the remaining space in trench 215B to line 230B. First liner 220A and first cap 225A are not attacked by agent 235A. Second liner 220B and second cap 225B are not attacked by agent 235B. The materials of first liner 220A and second liner 220B are the same as for liner 220 of FIG. 1 described supra. The materials of first cap 225A and second cap 225B are the same as for cap 225 of FIG. 1 described supra.

First agent 235A and second agent 235B form a binary system that generate, when mixed together, a reaction product that will (i) generate a chemical agent that will chemically attack one or more of the materials in the various layers of the semiconductor chip and/or the semiconductor substrate or (ii) physically or thermally damage the semiconductor chip when exposed, for example, by a increase in volume. In one example, first agent 235A comprises an isocyanate and second agent 235B comprises a polyol. In one example, first agent 235A comprises $BCl_3$ and second agent 235B is water. In one example, first agent 235A comprises sodium polyacrylate and second agent 235B is water or a water containing gel.

Figure 3:
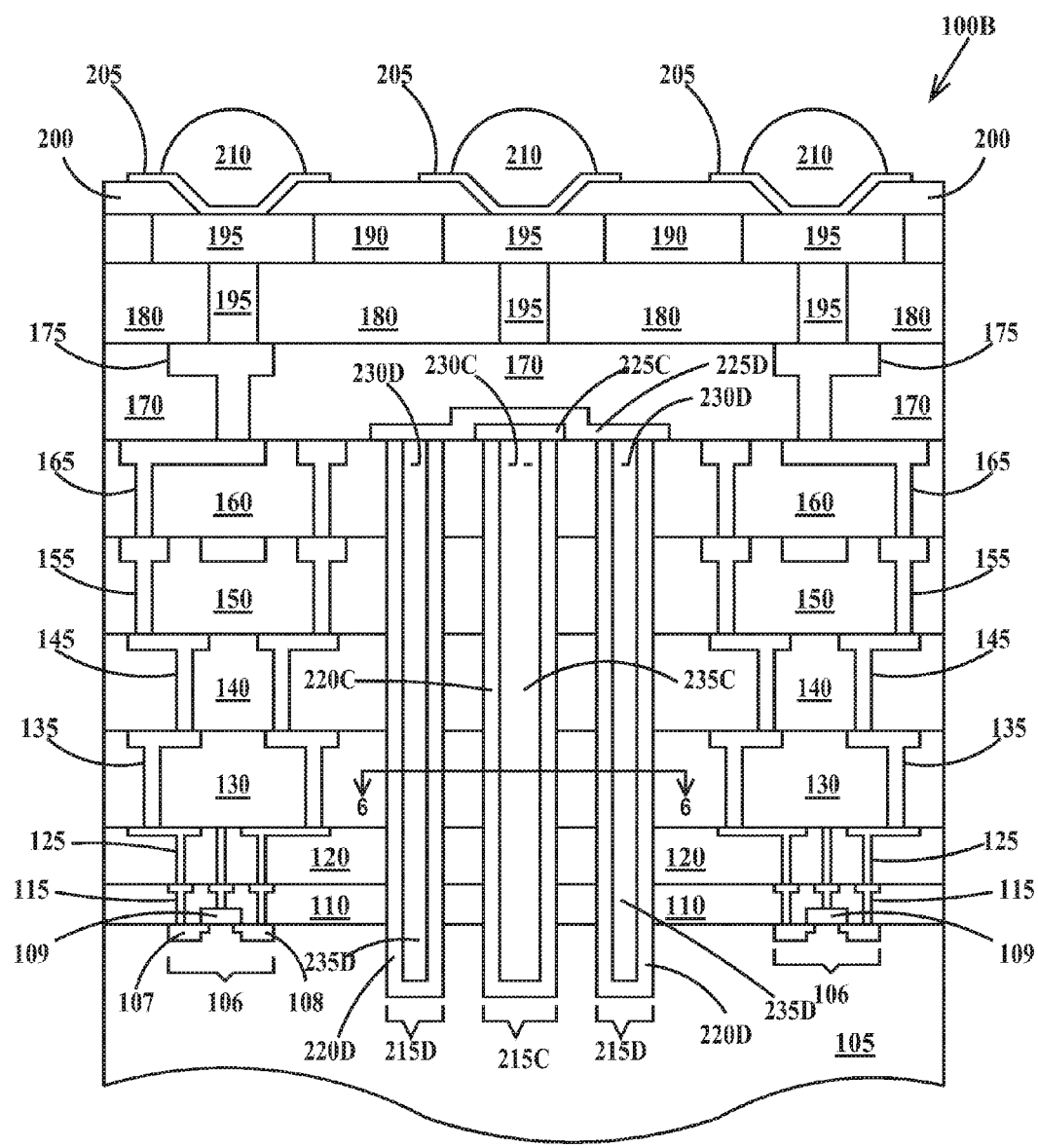
FIG. 3 is a cross-section of an exemplary integrated circuit containing a nested binary anti-reverse engineering structure according embodiments of the present invention.

FIG. 3 is a cross-section of an exemplary integrated circuit containing a nested binary anti-reverse engineering structure according embodiments of the present invention. Semiconductor chip 100B of FIG. 3 is similar to semiconductor chip 100 of FIG. 1. In FIG. 3, trench 215 of FIG. 1 is replaced with a pair of trenches, a third trench 215C and a fourth annular trench 215D surrounding third trench 215C. Third trench 215C is separated from fourth trench 215D by a ring of stacked semiconductor substrate 105, first dielectric layer 110, second dielectric layer 120, third dielectric layer 130, fourth dielectric layer 150 and sixth dielectric layer 160. Third trench 215C includes a third liner 220C, a third cap 225C and a third agent 235C that either completely fills remaining space (that space not taken up by liner 220C in trench 215C or fills the remaining space in trench 215C to line 230C. Fourth trench 215D includes a fourth liner 220D, a fourth cap 225D and a fourth agent 235D that either completely fills remaining space (that space not taken up by liner 220D) in trench 215D or fills the remaining space in trench 215D to line 230D. Third liner 220C and third cap 225C are not attacked by agent 235C. Fourth liner 220D and fourth cap 225D are not attacked by agent 235D. The materials of third liner 220C and fourth liner 220D are the same as for liner 220 of FIG. 1 described supra. The materials of third cap 225C and fourth cap 225D are the same as for cap 225 of FIG. 1 described supra.

Third agent 235C and fourth agent 235D form a binary system that generate, when mixed together, a material a material will (i) generate an agent that will chemically attack one or more of the materials in the various layers of the semiconductor chip and/or the semiconductor substrate or (iii) physically or thermally damage the semiconductor chip when exposed, for example, by a increase in volume. In one example, third agent 235C comprises an isocyanate and fourth agent 235D comprises a polyol. In one example, third agent 235C comprises $BCl_3$ and fourth agent 235D is water. In one example, third agent 235C comprises sodium polyacrylate and fourth agent 235D is water or a water containing gel.

Figure 4:
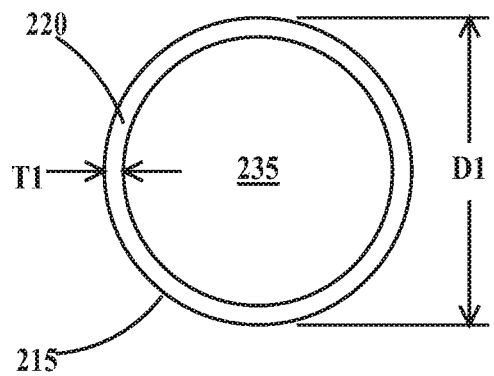
FIG. 4 is cross-section through line 4-4 of FIG. 1.

FIG. 4 is cross-section through line 4-4 of FIG. 1. In FIG. 4, trench 215 has a diameter D1 and liner 220 has a thickness T1. In one example, D1 is between 1 um and 10 um. In one example, T1 is between 10 nm and 100 nm.

Figure 5:
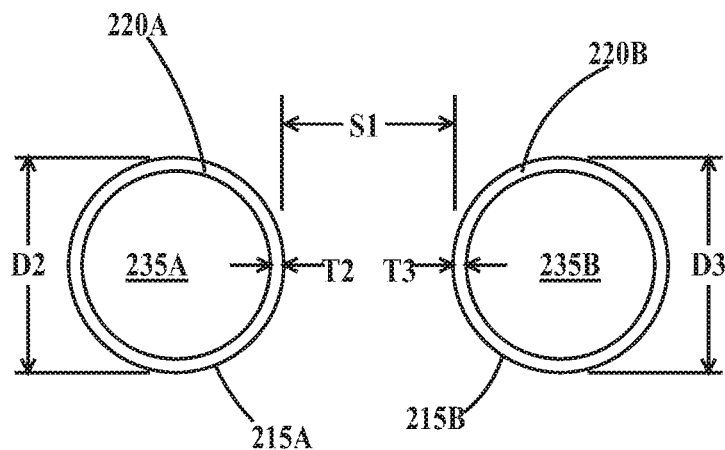
FIG. 5 is cross-section through line 5-5 of FIG. 2.
Figure 6:
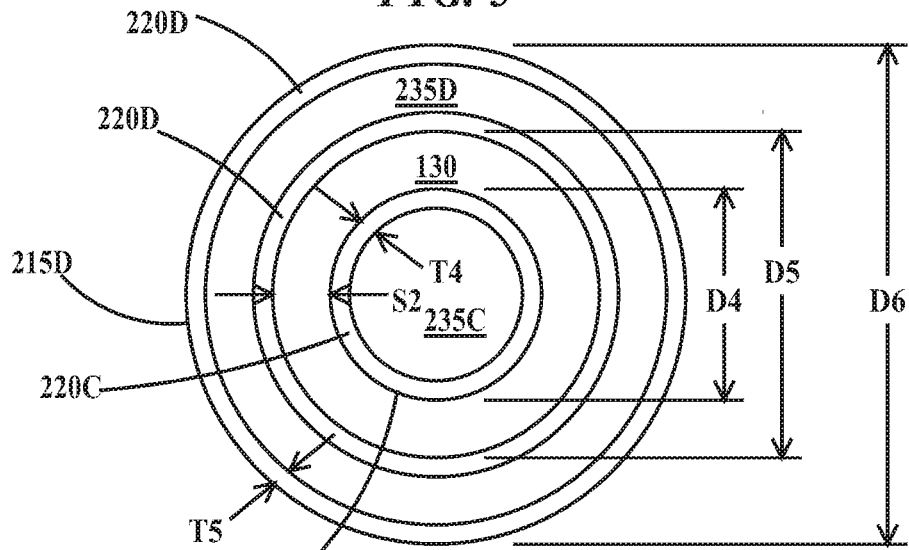
FIG. 6 is a cross-section through line 6-6 of FIG. 3.

FIG. 5 is cross-section through line 5-5 of FIG. 2. In FIG. 5, trench 215A has a diameter D2 and trench 215B has a diameter D3. Liner 220A has a thickness T2 and liner 220B has a thickness T3. In one example, D2 is between 1 um and 10 um. In one example, D3 is between 1um and 10 um In one example, T2 is between 10 nm and 100 nm In one example, T3 is between 10 nm and 100 nm FIG. 6 is a cross-section through line 6-6 of FIG. 3. In FIG. 6, trench 215C has a diameter D4 and trench 215D has an inside diameter D5 and an outside diameter D6. Liner 220C has a thickness T4 and liner 220D has a thickness T5. In one example, D4 is between 0.5 um and 5 um. In one example, D5 is between 1 um and 10 um. In one example, D6 is between 2 um and 20 um. In one example, T4 is between 10 nm and 100 nm. In one example, T5 is between 10 nm and 100 nm.

Figure 7A:
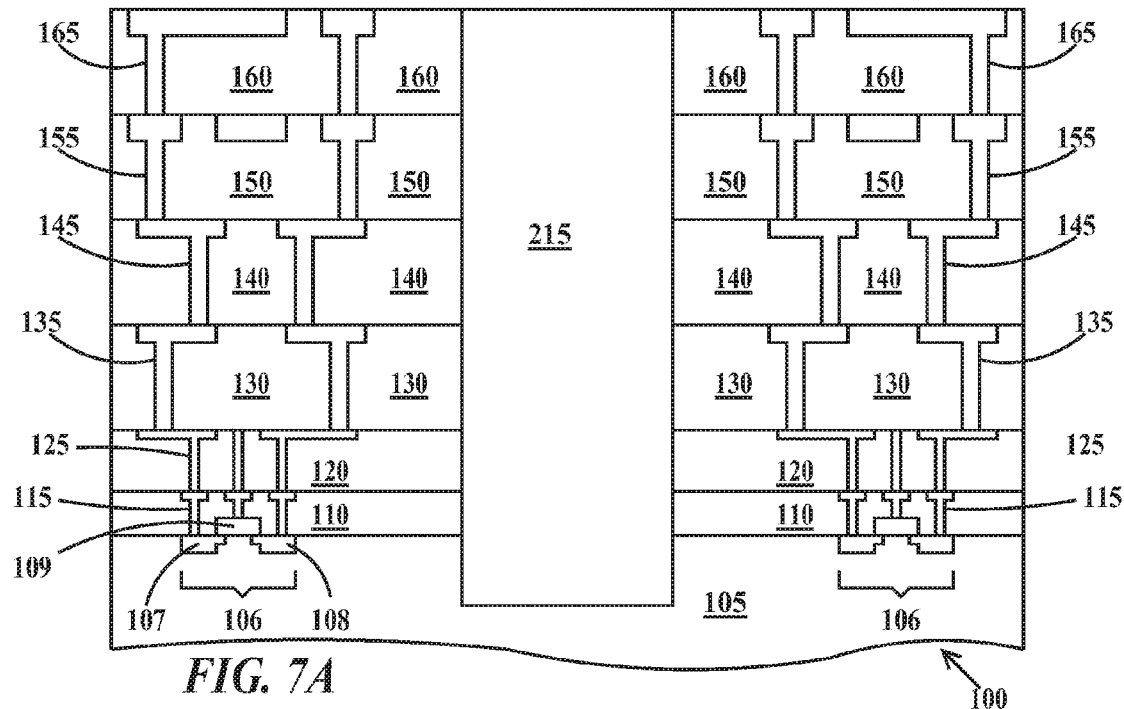
FIGS. 7A through 7D illustrate a method of fabricating an integrated circuit containing an anti-reverse engineering structure according embodiments of the present invention.
Figure 7B:
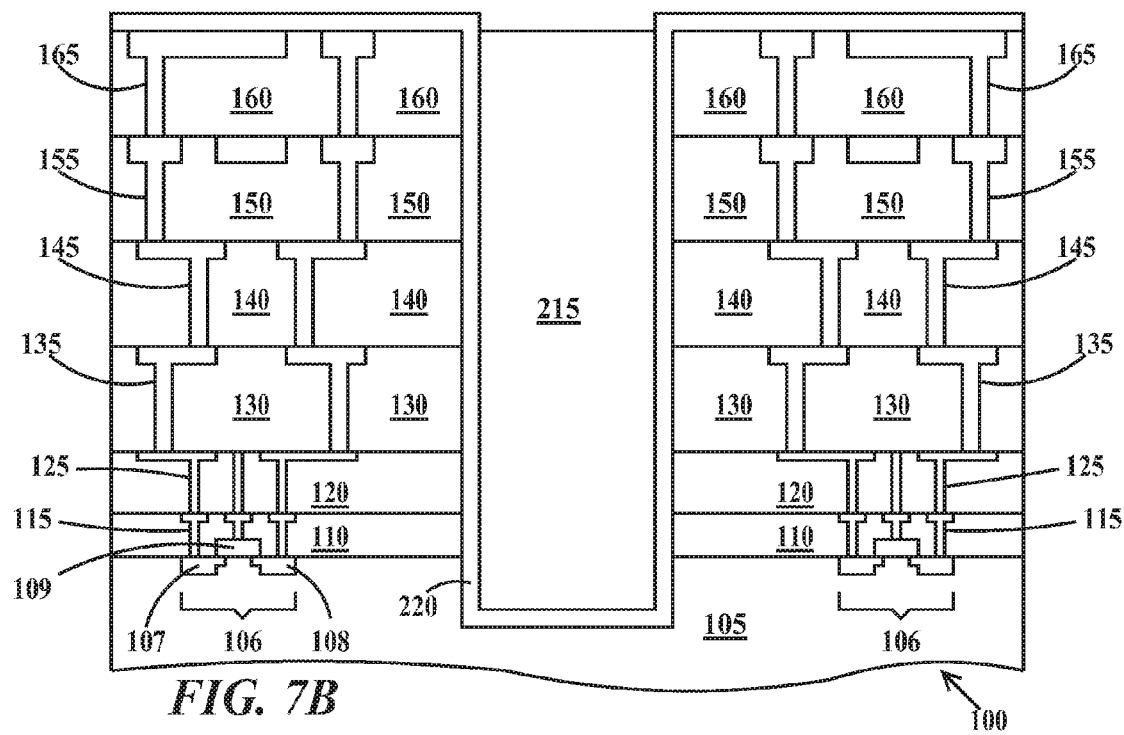
Figure 7C:
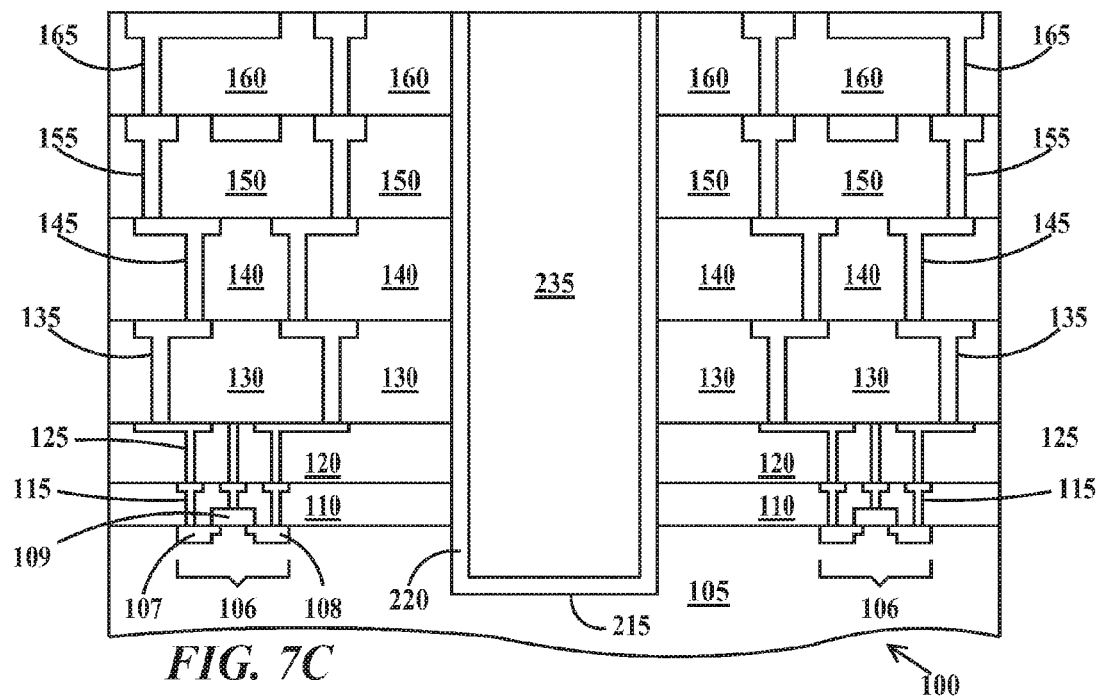
Figure 7D:
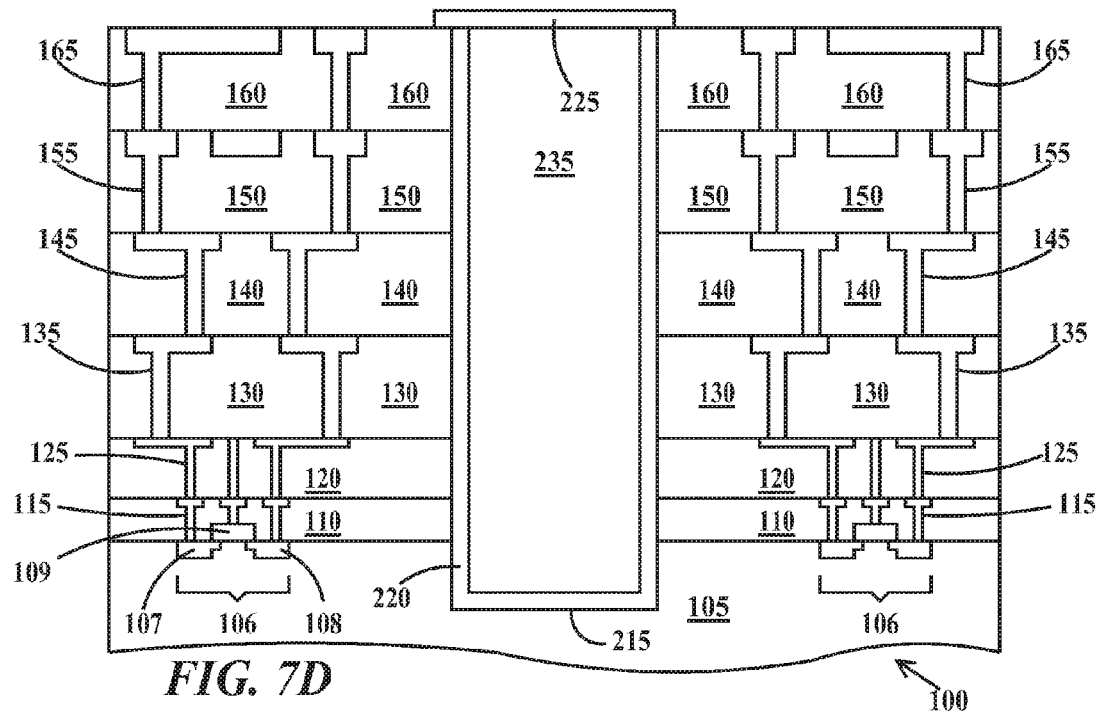

FIGS. 7A through 7D illustrate a method of fabricating an integrated circuit containing an anti-reverse engineering structure according embodiments of the present invention. In FIGS. 7A through 7B, the structure illustrated in FIG. 1 is used as an example. In FIG. 7A, semiconductor chip 100 is formed through dielectric layers 160 and a trench 215 is formed through dielectric layers 110, 120, 130, 140, 150, 160 into substrate 105. There were no wires 115, 125, 135, 145, 155, 165 in the dielectric layers in the regions of the dielectric layers that trench 215 was formed in. In FIG. 7B, liner 220 is formed. In one example, liner 220 is also formed on the top surface of dielectric layer 160. In FIG. 7C, liner 220 is removed from the top surface of dielectric layer 160 using, for example, a directional etch. In FIG. 7D, trench 215 is filled with agent 235 and cap 225 formed. The additional layers, wires and structures on top of layer dielectric 160 illustrated in FIG. 1 are next formed.

Figure 8A:
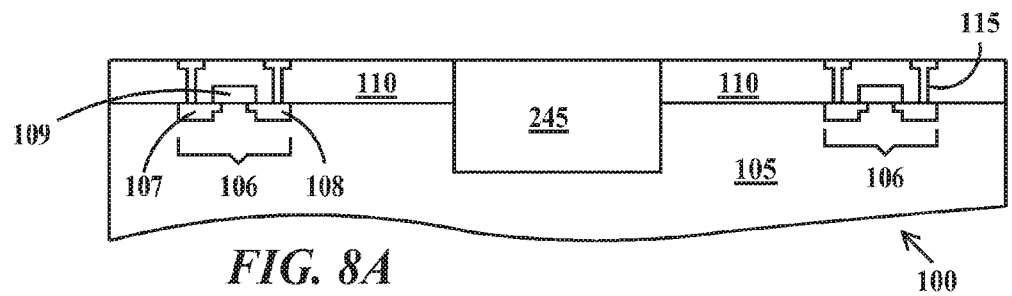
FIGS. 8A and 8B illustrate alternative steps forming the trench of FIG. 7A.
Figure 8B:
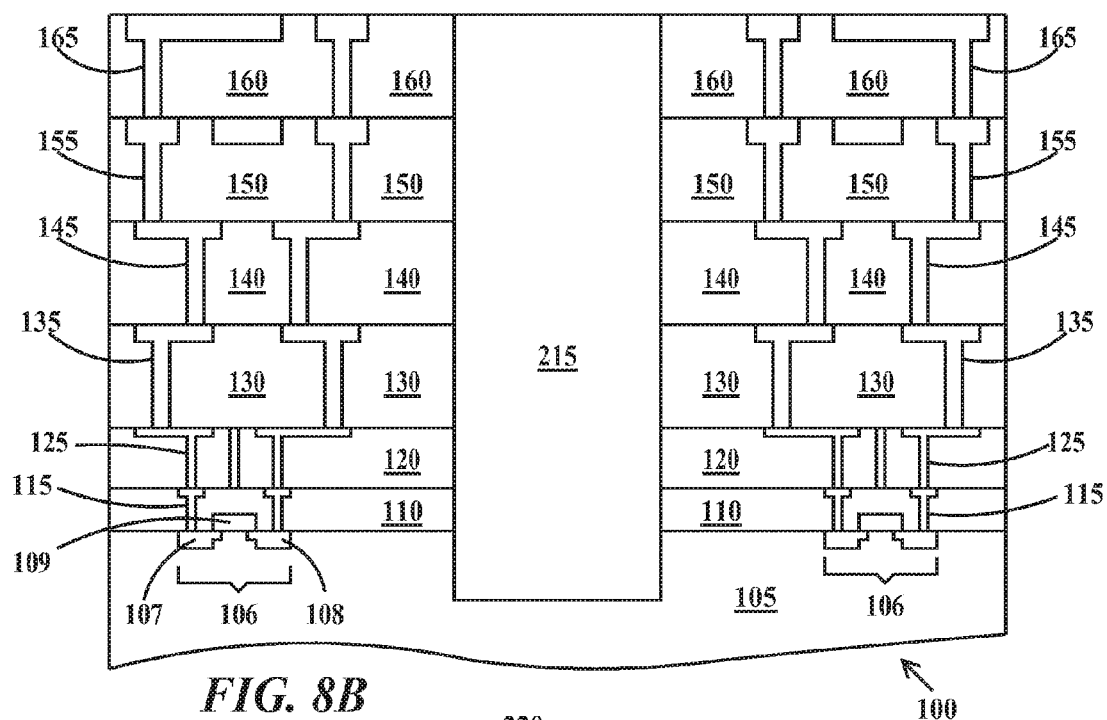

FIGS. 8A and 8B illustrate alternative steps forming the trench of FIG. 7A. In FIG. 8A, semiconductor chip 100 is completed only through dielectric layer 110 and a trench 245 formed from the top surface of dielectric layer 110 into substrate 105. There are no wires 115 or FETs 106 (or other devices) in the region of dielectric layer 110 and substrate 105 in which trench 245 is formed. In FIG. 8B, semiconductor chip is completed through dielectric layer 160. Trench 245 is filled with dielectric material from one or more subsequent layers (not shown) subsequently removed when trench 215 is formed through dielectric layers 120, 130, 140, 150, 160 into substrate 105. There were no wires 125, 135, 145, 155, 165 in the dielectric layers in the regions of the dielectric layers that trench 215 was formed in. The method next proceeds to FIG. 7B.

Figure 9:
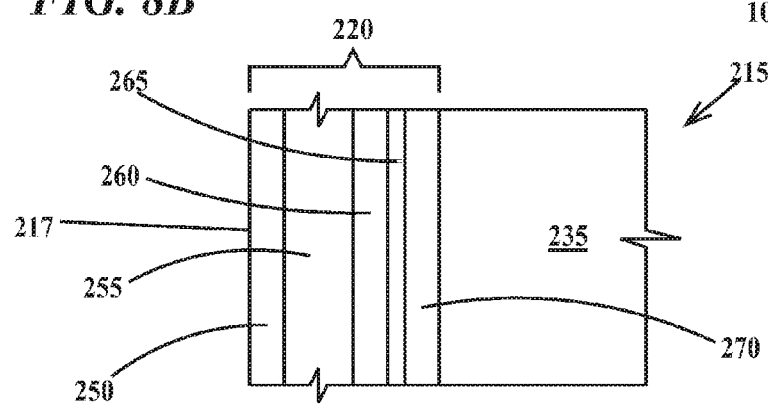
FIG. 9 is an exemplary cross-section of the sidewall layer of the trenches of FIGS. 1, 2 and 3 according to embodiments of the present invention.

FIG. 9 is an exemplary cross-section of the sidewall layer of the trenches of FIGS. 1, 2 and 3 according to embodiments of the present invention. In FIG. 9 liner 220 comprises a buffer layer 250 on sidewall 217 of trench 215. A stress absorption layer 255 is formed on buffer layer 250, a water barrier layer 260 is formed on stress absorption layer 255, an adhesion layer 265 is formed on water barrier layer 260 and a chemically resistive layer 270 is formed on adhesion layer 265. Chemically resistive layer 270 is not attacked by agent 235. One or more of layers 250, 255, 260 and 265 are optional, but layer 270 must be present. In the example that agent 235 is corrosive, chemically resistive layer 270 comprises Au or Pt or alloys of Au or alloys of Pt. In one example, adhesion layer 265 comprises Ti or Ta. In one example, water barrier layer 260 comprises $Si_3N_4$. In one example, stress absorption layer 260 comprises HSQ, MSQ, polyphenylene oligomer, $SiO_x(CH_3)_y$ or $SiC_xO_yH_y$ or SiOCH, SiCOH), or porous SiCOH. In one example, buffer layer 250 comprises TEOS oxide.

Figure 10:
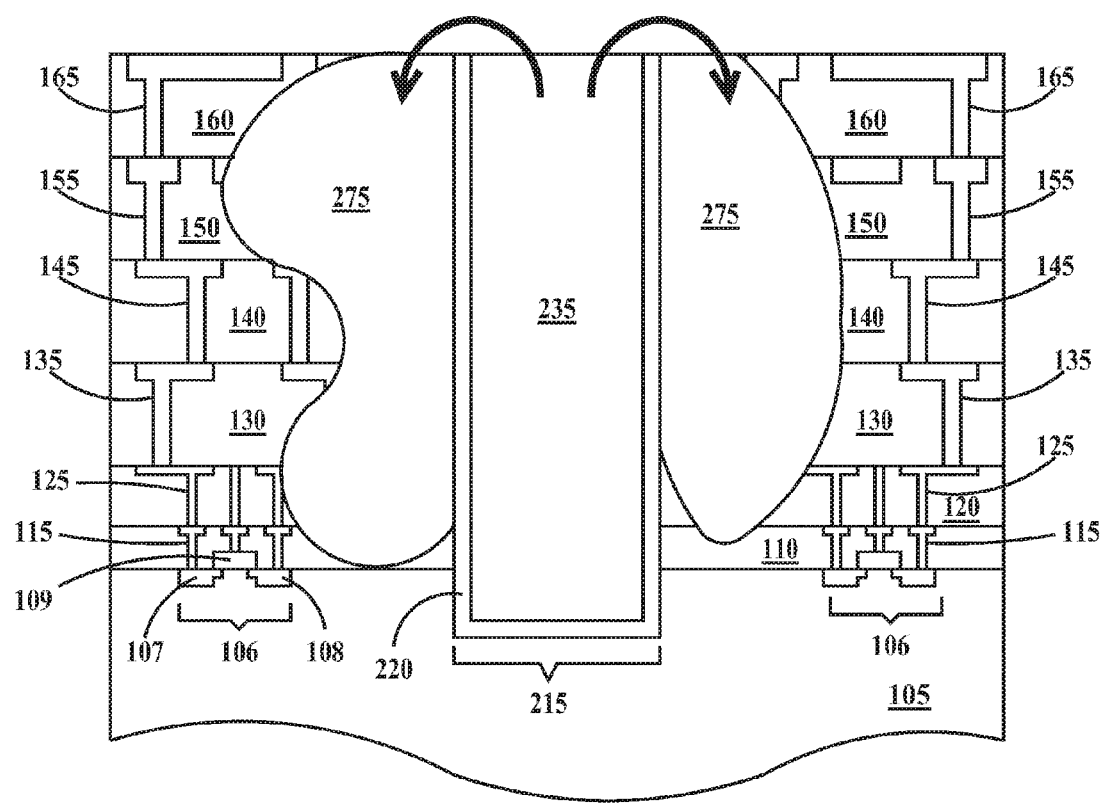
FIG. 10 is a cross-section illustrating the action of anti-reverse engineering structures according to embodiments of the present invention when the semiconductor chip is delayered from the top surface down.

FIG. 10 is a cross-section illustrating the action of anti-reverse engineering structures according to embodiments of the present invention when the semiconductor chip is delayered from the top surface down. In FIG. 10 semiconductor chip 100 will be used as an example. Upon delayering from the top of semiconductor chip 100 to dielectric layer 160, cap 225 (see FIG. 1) will be removed and agent 235 will be released into regions 275. In regions 275, one or more of dielectric layers 110, 120, 130, 140, 150 and 160 are not chemically inert to chemical agent 235 (or are not chemically inert to chemical agent generated by the reaction of chemical agent 235 and air, oxygen or water) will be damaged or destroyed, one or more of wires 115, 125, 135, 145, 155 and 165 are not chemically inert to chemical agent 235 (or are not chemically inert to chemical agent generated by the reaction of chemical agent 235 and air, oxygen or water) will be damaged or destroyed, or both one or more of dielectric layers 110, 120, 130, 140, 150 and 160 and one or more of wires 115, 125, 135, 145, 155 and 165 will be damaged or destroyed rending reverse engineering difficult or impossible.

Figure 11:
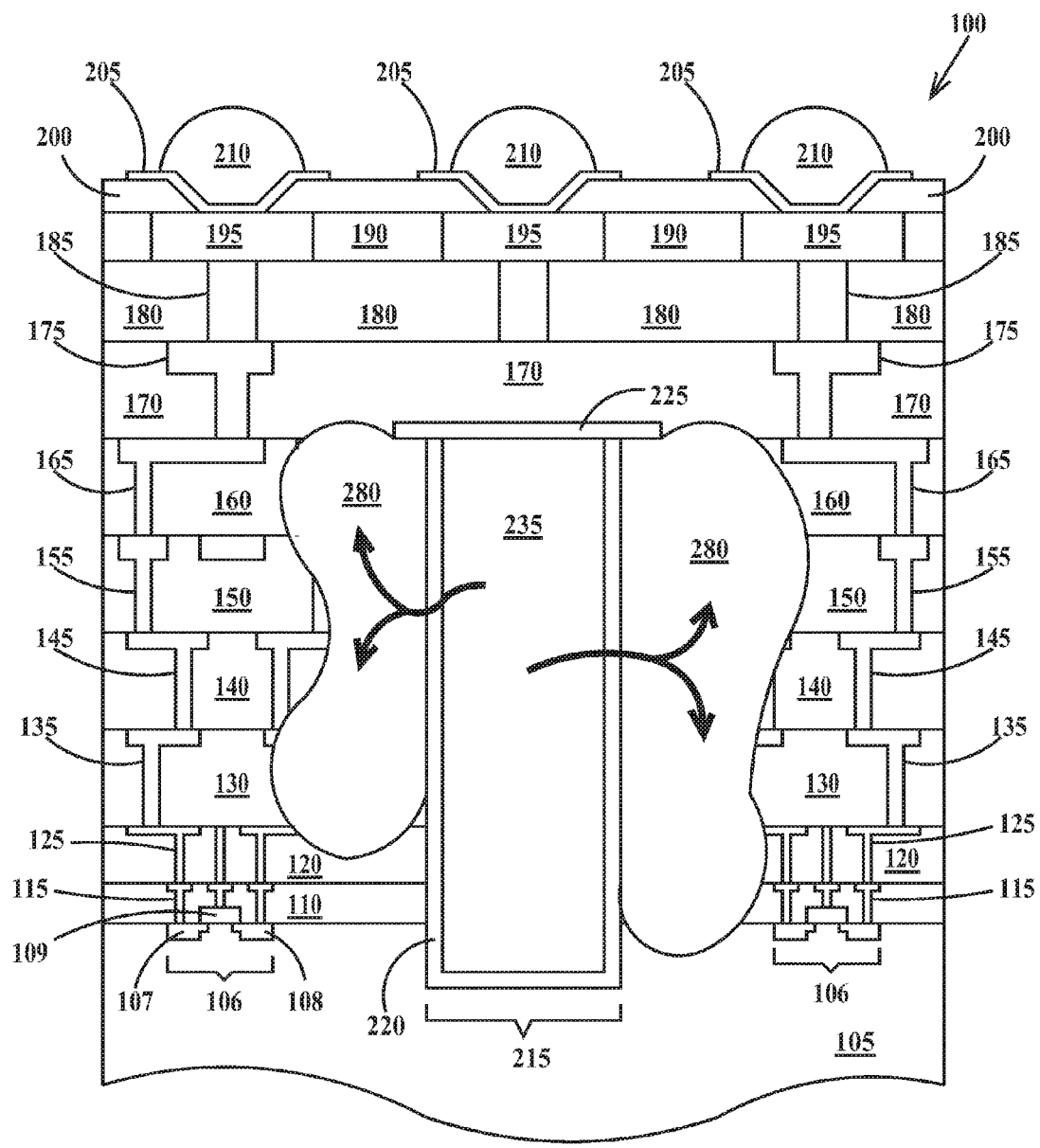
FIG. 11 is a cross-section illustrating the action of anti-reverse engineering structures according to embodiments of the present invention when the semiconductor chip is cross-sectioned.

FIG. 11 is a cross-section illustrating the action of anti-reverse engineering structures according to embodiments of the present invention when the semiconductor chip is cross-sectioned. In FIG. 11 semiconductor chip 100 will be used as an example. Upon cross-sectioning from the side of semiconductor chip 100 liner 220 will be breached and agent 235 will be released into regions 280. In regions 280, one or more of dielectric layers 110, 120, 130, 140, 150, 160 and 170 are not chemically inert to chemical agent 235 (or are not chemically inert to chemical agent generated by the reaction of chemical agent 235 and air, oxygen or water) and will be damaged or destroyed, one or more of wires 115, 125, 135, 145, 155, 165 and 175 will be damaged or destroyed, or both one or more of dielectric layers 110, 120, 130, 140, 150, 160 and 170 and one or more of wires 115, 125, 135, 145, 155, 165 and 175 are not chemically inert to chemical agent 235 (or are not chemically inert to chemical agent generated by the reaction of chemical agent 235 and air, oxygen or water) will be damaged or destroyed rending reverse engineering difficult or impossible.

Thus the embodiments of the present invention provide structures that comprise sealed trenches containing agents that will damage or destroy one or more of the materials in the various layers of the semiconductor chip (and/or the semiconductor substrate) by chemical attack physical or thermally stress when the seal around the trench is broken, thereby preventing reverse engineering or making reverse engineering very difficult.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An anti-reverse engineering semiconductor method, comprising:
   providing a semiconductor substrate;
   forming a stack of wiring levels from a first wiring level to an intermediate wiring level, said first wiring level closest to said semiconductor substrate and said intermediate wiring level furthest from said semiconductor substrate;
   forming active devices contained in said semiconductor substrate and said first wiring level, each wiring level of said stack of wiring levels comprising a dielectric layer containing electrically conductive wire;
   forming one or more trenches extending from said intermediate wiring level, through said first wiring level into said semiconductor substrate;
   forming a liner on sidewalls and a bottom of said one or more trenche such that said one or more trenches comprises an open space; and
   (i) filling said open space of said one or more trenches with a first chemical agent that can cause damage to or destroy portions of at least one wiring level of said stack of wiring levels or (ii) filling a first group of said one or more trenches with a second chemical agent and a filling a second group of said one more trenches a third chemical agent, a mixture of said second chemical agent and said third chemical agent generating a fourth chemical agent that can cause damage to or destroys portions of at least one wiring level of said stack of wiring levels;
   forming a cap sealing a top of said open space of said one or more trenches, wherein each of said liner and said cap is configured to be damaged during a reverse engineering process such that said one or more trenches is exposed to said at least one wiring level of said stack of wiring levels; and
   forming one or more additional wiring levels on top of said intermediate wiring level.

2. The method of claim 1, wherein said one or more trenches do not extend completely through said semiconductor substrate.

3. The method of claim 1, wherein each of said one or more trenches is filled with said first chemical agent and said first chemical agent can attack wires, dielectric layers or both wires and dielectric materials of said at least one wiring level of said stack of wiring levels.

4. The method of claim 1, wherein said chemical agent generates a fifth chemical agent that can chemically attack wires, dielectric layers or both wires and dielectric materials of said at least one wiring level of said stack of wiring levels when said chemical agent is exposed to air, oxygen or water.

5. The method of claim 1, wherein said mixture of second chemical agent and said third chemical agent generates heat or wherein said mixture of second chemical agent and said third chemical agent generates a material that expands in volume.

* * * * *